United States Patent [19]

Asada et al.

[11] Patent Number: 4,796,265
[45] Date of Patent: Jan. 3, 1989

[54] IMAGING USING COLLECTIVELY CONTROLLED MULTIPLE BEAMS

[75] Inventors: Kenichiro Asada, Tokyo; Takashi Mama, Yokohama; Takanobu Fujioka, Chofu, all of Japan

[73] Assignee: Ricoh Company, Limited, Tokyo, Japan

[21] Appl. No.: 35,159

[22] Filed: Apr. 6, 1987

[30] Foreign Application Priority Data

Apr. 5, 1986 [JP] Japan .................................. 61-78971
Mar. 31, 1987 [JP] Japan .................................. 62-76316

[51] Int. Cl.$^4$ ............................................. H01S 3/10
[52] U.S. Cl. ...................................... 372/31; 372/26; 372/32
[58] Field of Search ...................... 372/26, 29, 31, 32

[56] References Cited

U.S. PATENT DOCUMENTS

| | | | |
|---|---|---|---|
| 4,160,218 | 7/1979 | White III | 372/29 |
| 4,237,427 | 12/1980 | Holland | 372/38 |
| 4,309,671 | 1/1982 | Malyon | 372/32 |
| 4,460,249 | 7/1984 | Vincent | 372/29 |
| 4,592,057 | 5/1986 | Comerford | 372/38 |

Primary Examiner—Léon Scott, Jr.
Attorney, Agent, or Firm—Cooper & Dunham

[57] ABSTRACT

An imaging system includes a plurality of semiconductor lasers for emitting a plurality of laser beams for use in forming an image on a photosensitive member. A laser driver circuit is provided for each of the plurality of lasers, and a plurality of photodectors are also provided, each detecting the light intensity of the corresponding one of the laser beams emitted from the lasers. A light intensity stabilizing control circuit is provided to stabilize the light intensity of each of the plurality of laser beams using one of the detected light intensities as a reference and adjusting the light intensity of each of the other beams such that a difference between the reference and the light intensity of each of the other beams is within a predetermined range.

11 Claims, 9 Drawing Sheets

IMAGING USING COLLECTIVELY CONTROLLED MULTIPLE BEAMS

BACKGROUND OF THE INVENTION

1. Field of the Invention

This invention generally relates to an imaging system using a multiple of light beams, such as a color imaging system, and, in particular, to a method and system for stabilizing the light intensity of each of a plurality of light beams used for imaging. More specifically, the present invention relates to an imaging system and method using a multiple of light beams emitted from one or more semiconductor lasers, whereby the light intensity of each of the multiple of light beams is stabilized uniformly.

2. Description of the Prior Art

An imaging system using a plurality of light beams is well known and it is typical in the field of a multiple color imaging system, such as a color copier. Such an imaging system using a plurality of light beams typically includes a plurality of semiconductor lasers as the source of each of the light beams. However, as the characteristic of the semiconductor laser varies depending on the surrounding temperature, there is usually provided a stabilizing feed-back loop for keeping the characteristic of the semiconductor laser stabilized, thereby preventing the light intensity of the light beam emitted from the semiconductor laser from being adversely affected by the changes in the surrounding temperature. However, in accordance with the prior art, such a stabilizing feed-back loop is usually provided independently for each of the semiconductor lasers. Since the characteristic sometimes differs from one semiconductor laser to another, the prior art stabilizing technique is often not sufficient in obtaining an image of high quality. Particularly, in the case of a color copier, different color component images of the same original image are exposed to the same or a plurality of photosensitive members, so that if there is a difference in light intensity between the different color component images, the resulting image would not be a faithful reproduction of the original image.

Referring now to FIG. 3, a typical scheme of stabilizing the output of a single semiconductor laser having a stabilizing feed-back loop is shown. As shown, a laser driver circuit 1 modulates a driving current to be applied to a semiconductor laser 2 in accordance with a video data signal supplied thereto. The semiconductor laser 2 receives the driving current modulated with video information and emits a light beam 3 in response thereto. The light beam 3 thus emitted is directed towards an imaging member, such as a photosensitive member, on which an electrostatic latent image corresponding to the video information is formed. As shown in FIG. 3, the light beam 3 emitted from the semiconductor layer 2 is partially reflected by a beam splitter 4, and the partially reflected light beam is directed towards a light intensity detector 5, where the intensity of the light beam 3 is detected. Then, the detector 5 supplies a detection signal to the driver circuit 1, thereby establishing a stabilizing feed-back loop to stabilize the light intensity of the light beam 3 to be emitted from the laser 2.

In a prior art imaging apparatus using a plurality of semiconductor lasers, such a stabilizing feed-back loop was provided for each of the lasers independently from the other. With such a structure, although the semiconductor lasers could be stabilized against changes of the surrounding temperature to the like independently, there still remained differences in characteristics among individual semiconductor lasers. For this reason, there was a limit in enhancing the quality of a resulting image using multiple of light beams. This was particularly noticeable when the prior art imaging system using a plurality of semiconductor lasers was applied to a color copier because the balance of component colors became inappropriate.

SUMMARY OF THE INVENTION

In accordance with the present invention, a plurality of light sources are provided and each of the light sources emits a light beam for use in imaging. And the light intensity of each of the light beams is detected. Control means is provided for controlling the driving conditions of each of the plurality of light sources based on the detected light intensity of a selected one of the plurality of light beams. In this manner, all of the light beams are controlled to be at the same intensity level.

It is therefore a primary object of the present invention to obviate the disadvantages of the prior art and to provide an improved system and method for forming an image using a plurality of light beams.

Another object of the present invention is to provide an improved system and method for stabilizing a plurality of light beams to be used for forming an image.

A further object of the present invention is to provide an improved imaging system using a plurality of light beams, which is useful for application to a color copier.

Other objects, advantages and novel features of the present invention will become apparent from the following detailed description of the invention when considered in conjunction with the accompanying drawings.

DESCRIPTION OF THE PREFERRED EMBODIMENTS

Figure 1:
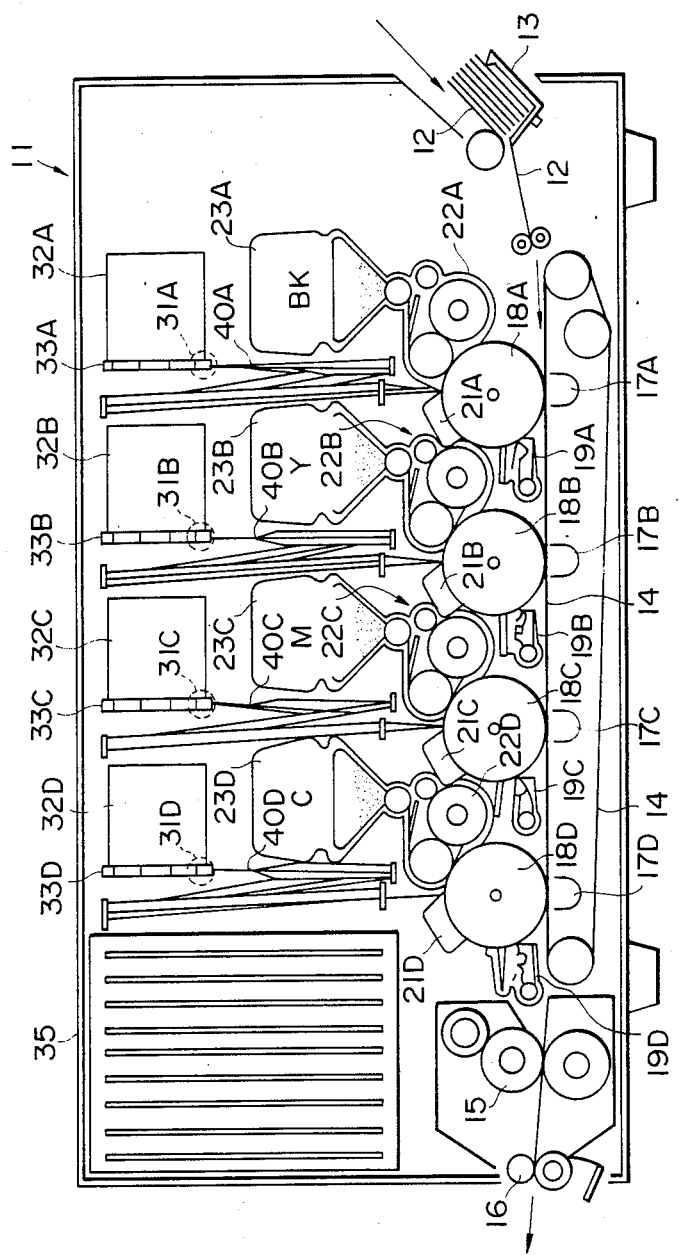
FIG. 1 is a schematic illustration showing the overall structure of a color printer using a plurality of laser light beams constructed in accordance with one embodiment of the present invention.
Figure 2:
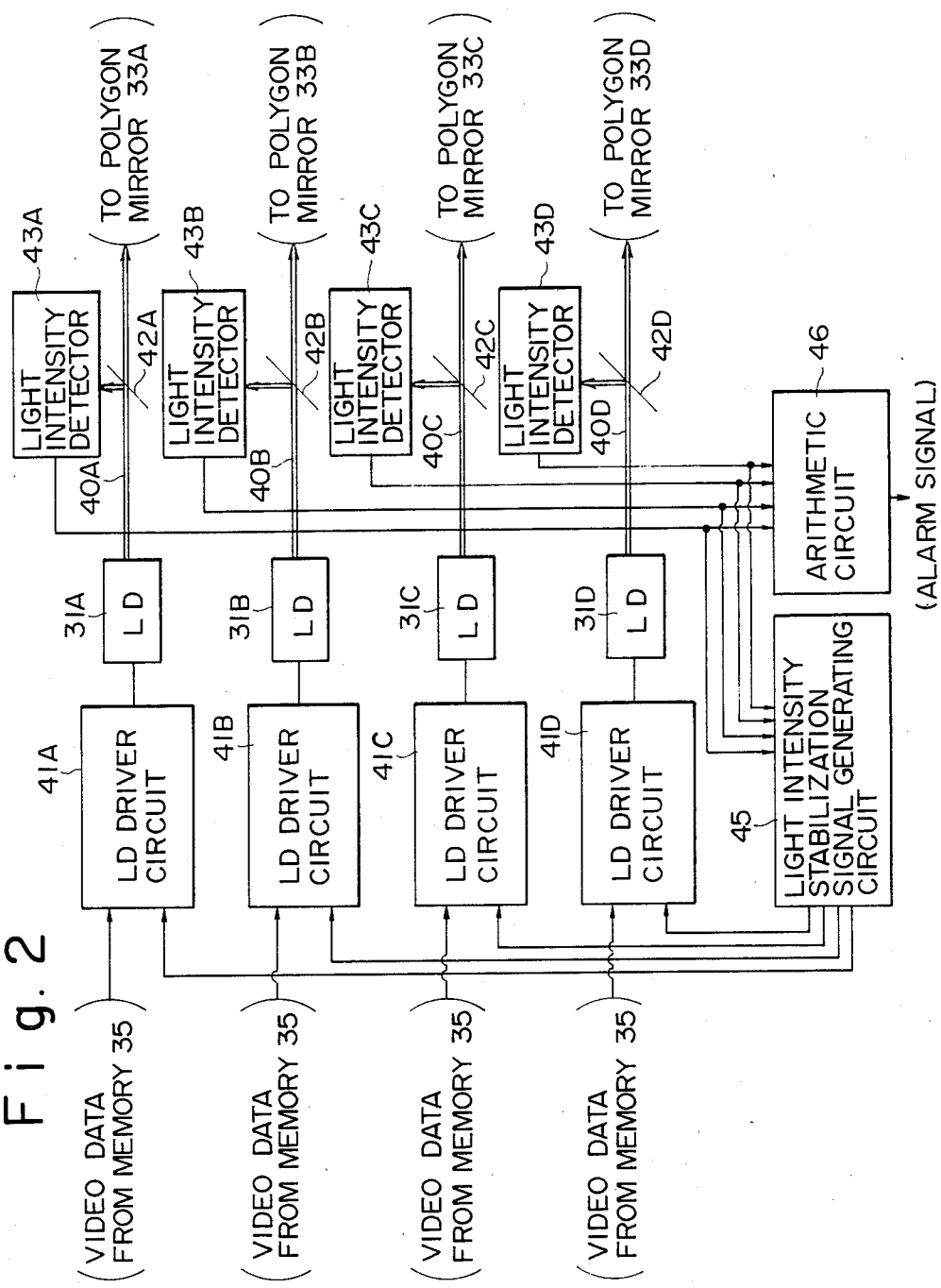
FIG. 2 is a block diagram showing a control system for controlling the light intensity of each of a plurality of semiconductor lasers provided in the printer shown in FIG. 1.
Figure 3:
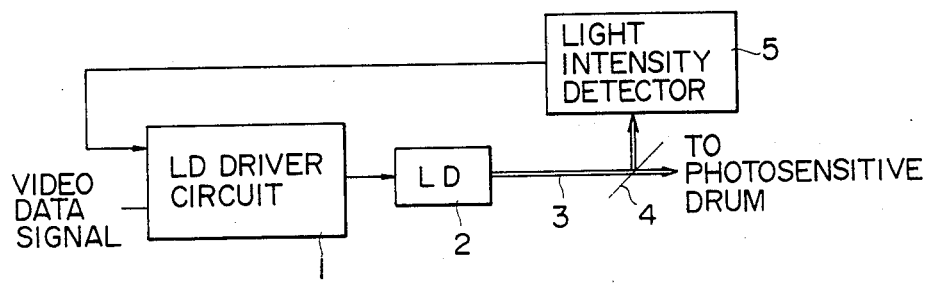
FIG. 3 is a block diagram showing a typical prior art stabilizing feed-back loop for stabilizing the intensity of a single laser light beam.

Referring to FIGS. 1 and 2, there is schematically shown a color printer using a plurality of laser light beams constructed in accordance with one embodiment of the present invention. As shown in FIG. 1, the present printer includes a housing 11 generally rectangular in shape, and a paper feeding section 13 storing a stack of a plurality of sheets of print paper 12 is provided at the right hand side of the housing viewing into FIG. 1. The sheets of print paper 12 are fed one by one from the topmost sheet of the stack. A print paper transporting belt 14 extends horizontally at the bottom of the housing 11 as supported between a pair of rollers. The belt 14 is driven to travel counterclockwise so that the sheet of print paper 12 fed from the paper feeding section 13 is transported to the left in FIG. 1 horizontally as riding on the upper run portion of the belt 14. While the sheet of print paper 12 is being transported riding on the belt 14, a plurality of different color component images are formed one on top of another to form a printed color image thereof as will be described more in detail later. At the end of the upper run portion of the belt 14, the sheet of print paper 12 having thereon a printed color image is transported into an image fixing device 15 comprised of a pair of rollers and the sheet of print paper 12 is then discharged out of the printer housing 11 by means of a paper discharging device 16.

Inside the loop of the endless belt 14 is disposed a plurality (four in the illustrated embodiment) of image transferring corona units 17A through 17B arranged horizontally spaced apart from each other and in parallel with the inner surface of the upper run portion of the belt 14. A plurality (four in the illustrated embodiment) of photosensitive drums 18A through 18D are also provided in parallel arrangement with the upper run portion of the belt 14 in a spaced apart relation. Each of the photosensitive drums 18A through 18D is located immediately above and in an opposed relation with the corresponding one of the image transferring corona unit 17A through 17D with the upper run portion of the belt 14 sandwiched therebetween. Each of the photosensitive drums 18A through 18D is driven to rotate clockwise in synchronism with the advancement of the belt 14. Around the periphery of each of the photosensitive drums 18A through 18D are disposed various devices, such as a cleaner 19A, 19B, 19C or 19D, primary charger 21A, 21B, 21C or 21D, and developing device 22A, 22B, 22C or 22D. The developing devices 22A through 22D contain toner particles 23A through 23D, respectively, which are different in color. For example, the toner particles 23A through 23B include black (BR), yellow (Y), magenta (M) and cyan (C) toner particles, respectively.

Also provided inside of and near the top wall of the housing 11 is a plurality of four in the illustrated embodiment) of semiconductor lasers (LD) 31A through 31D arranged horizontally in a spaced apart relation. Laser light beams 40A through 40D emitted from these semiconductor lasers 31A through 31D, respectively, are deflected by respective rotating polygon mirrors 33A through 33D which are driven to rotate by respective pulse motors 32A through 32D over a predetermined angle repetitively. Accordingly, the repetitively deflected laser light beams 40A through 40D scan across the peripheral surfaces of the respective photosensitive drums 18A through 18D in the longitudinal direction thereof after passing through associated optical systems including reflecting mirrors and focusing lenses. In this manner, an electrostatic latent image is formed on each of the photosensitive drums 18A through 18D. It is to be noted that each of the image formed on each of the drums 18A through 18D corresponds to a different color component image. And, thus, when these different color component images are developed by toner particles different in color and then transferred to the sheet of print paper 112 one on top of another, there is obtained a color reproduced image on the sheet of print paper 12. Also shown in the structure of FIG. 1 is a memory 35 which stores image information to be printed, and, thus, the image information to be printed is supplied to each of the semiconductor lasers 31A through 31D for modulating the intensity of each of the laser light beams to be emitted.

FIG. 2 shows in block form a control system for controlling the operation of each of the semiconductor lasers 31A through 31D in a centralized manner, which is incorporated in the printer showing in FIG. 1. As shown in FIG. 2, the control system includes a plurality (four in the illustrated embodiment) of laser driver circuits 41A through 41D each of which is connected to the corresponding one of the four semiconductor lasers 31A through 31D. That is, a video data signal of image information to be printed is supplied from the memory 35 to each of the laser driver circuits 41A through 41D, and the laser driver circuits 41A through 41D drive the respective semiconductor lasers 31A through 31D in accordance with the respective video data signals, so that the laser light beams 40A through 40D are modulated in light intensity correspondingly. Thus, when these modulated laser light beams 40A through 40D are applied to the respective photosensitive drums 18A through 18D, there are formed electrostatic latent images. Each of the laser light beams 40A through 40D is partially reflected by a corresponding one of beam splitters 42A through 42D and directed to impinge on a corresponding one of a plurality of light intensity detectors 43A through 43D. Therefore, the light intensity of each of the emitted laser light beams 40A through 40D may be detected. Detection output signals from the light intensity detectors 43A through 43D are all supplied to a light intensity stabilization signal generating circuit 45, where those detection output signals are processed in accordance with a predetermined manner, as will be described in more detail later, and correction signals are supplied to the respective laser driver circuits 41A through 41D so as to adjust the driving conditions of the lasers 31A through 31D, thereby obtaining uniformity in light intensity level in the emitted laser light beams 40A through 40D. The detection output signals from the respective light intensity detectors 43A through 43D are also supplied to an arithmetic circuit 46.

In the preferred embodiment of the present invention, the light intensity stabilization signal generating circuit 45 is so structured that a particular one of the four detection output signals from the respective light intensity detectors 43A through 43D is selected as a reference and each of the rest of the detection output signals from the light intensity detectors 43A through 43D is compared with this particular one, thereby producing a correction signal for bringing the difference within a predetermined range. That is, if the detection output signal from the first light intensity detector 43A is selected as a reference signal, the detection output signal from each of the other three light intensity detectors 43B through 43D is compared with this reference signal. And, then, if the difference between the reference signal and each of the other three signals is beyond a predetermined range, a correction signal is produced and supplied to the corresponding one of the laser driver circuits 41B through 41D to bring the difference within the predetermined range. With this integrated feed-back structure, all of the four laser light beams 40A through 40D are controlled to be uniform in light intensity.

On the other hand, in the preferred embodiment of the present invention, the arithmetic circuit 46 is structured to examine whether or not the scatter among the four detection output signals from the respective light intensity detectors 43A through 43D exceeds a predetermined allowable range and to produce an alarm signal if the scatter has been found to exceed the predetermined allowable range.

With the above-described structure, all of the four laser light beams 40A through 40D are maintained substantially at the same light intensity level, so that an appropriate balance of different color components can be obtained at all times. In addition, with the provision of the means for monitoring the degree of scatter in light intensity among all of the four laser light beams 40A through 40D, the system prevent the formation of an image with intolerable scatter in light intensity among the plurality of laser light beams 40A through 40D.

In the above-described embodiment, four semiconductor lasers 31A through 31D and four photosensitive drums 18A through 18D have been provided. It should be noted, however, that the number of semiconductor lasers and associated photosensitive members are not limited only to this embodiment, and the number may be determined arbitrarily as desired. Besides, the light intensity detectors 43A through 43D are separately provided from the semiconductor laser 31A through 31D in the above-described embodiment; however, each of such light intensity detectors may be comprised of a pin photodiode disposed inside of a package of the corresponding one of the semiconductor lasers 31A through 31D. In this case, the pin photodiode constituting one of the light intensity detectors 43A through 43D is provided integrally with the associated one of the semiconductor lasers 31A through 31D. It should also be noted that the arithmetic circuit 46 may be discarded, if desired.

In general, the output intensity characteristic of a semiconductor layer is extremely sensitive to the surrounding temperature. It is normally required to control or stabilize the intensity of light emitted from a semiconductor laser by providing a stabilizing feed-back loop if the semiconductor laser is to be used under the condition of the varying surrounding temperature. Such a feed-back loop for controlling the output of a semiconductor laser may be constructed in various forms and one of them uses a counter, in which case the feed-back loop can be made simple in structure and yet allows to obtain a stable control operation. Typical prior art output control systems for controlling the output of a semiconductor laser using a counter are disclosed, for example, in Japanese Patent Laid-open Publications, Nos 60-171863, 61-174786 and 61-174787.

Figure 4:
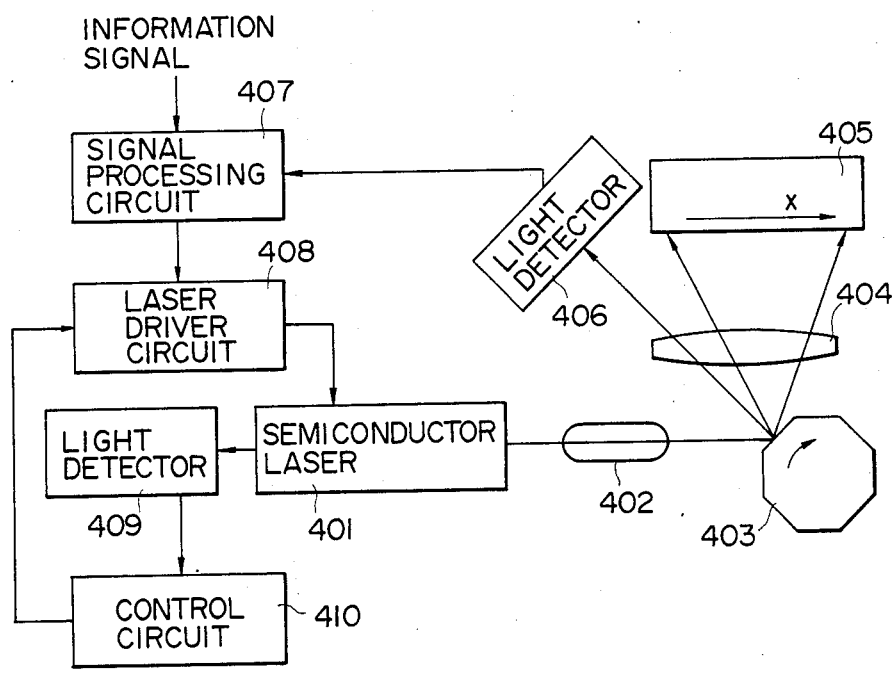
FIG. 4 is a schematic illustration showing the overall structure of a laser beam printer.

FIG. 4 schematically shows partly in block form the overall structure of a laser printer including a stabilizing feed-back loop for compensating the output of a laser light beam against changes in the surrounding temperature. As shown, a laser beam emitted from semiconductor laser 401 is collimated by a collimator lens 402 and the thus collimated laser beam is deflected by a rotating polygon mirror over a predetermined angle. The, the deflected laser beam passes through a f$\theta$ lens 404 and is focused on the surface of a photosensitive member 405 which is charged to a predetermined polarity uniformly. The laser beam spot formed on the surface of the photosensitive member 405 is scanned in the direction X indicated by the arrow repetitively while the photosensitive member 405 is being rotated in a predetermined direction. A light detector 406 is disposed outside the angle over which the deflected laser beam impinges on the photosensitive member 405 but within the angle of deflection of the laser beam by the polygon mirror 403. Thus, each time when the laser beam is deflected by one of the reflecting facets of the polygon mirror 403, the deflected laser beam first impinges on the light detector 406 prior to scanning across the width of the photosensitive member 405. Upon impingement of the deflected laser beam, the light detector 406 produces as its output a sync signal which is supplied to a signal processing circuit 407. An image information (video data) signal containing image information to be printed is also supplied to the signal processing circuit 407 from an appropriate source. The signal processing circuit 407 supplies this image information signal to a laser driver circuit 408; however, the timing of supply of this image information signal to the laser driver circuit 408 is controlled by the sync signal supplied from the light detector 406.

In accordance with the image information signal supplied from the signal processing circuit 407, the laser driver circuit 408 drives the semiconductor laser 401, so that the laser light beam emitted from the laser 401 is modulated in accordance with the image information signal, and, thus, when it is scanned across the surface of the photosensitive member 405, there is formed an electrostatic latent image thereon is accordance with a pattern corresponding to the image information signal. This latent image is then developed with toner and the toner image is transferred to a sheet of paper, as well known in the art.

In the structure shown in FIG. 4, a laser beam is also emitted rearwardly from the semiconductor laser 401 and this rearwardly emitted laser beam is incident to another light detector 409, which supplies a detection output signal to a control circuit 410, which, in turn, supplies a control signal to the laser driver circuit 408 in response to the detection output signal. Thus, there is formed a feed-back control loop including the laser 401, light detector 409, control circuit 410 and laser driver circuit 408, and this feed-back loop serves to maintain the intensity of laser beam emitted from the laser 401 substantially at constant irrespective of changes in the surrounding condition, such as temperature. In the structure shown in FIG. 4, the rearwardly emitted laser beam is used to detect the light intensity of an emitted laser beam, and, thus, this structure is equivalent to the case in which the light detector 409 is incorporated into the package of the laser 401 as described before. With this structure, as different from the case in which the forwardly emitted laser beam is partly reflected as in the case shown in FIG. 2, the light intensity of the laser beam which is actually used in imaging is not reduced.

Figure 5:
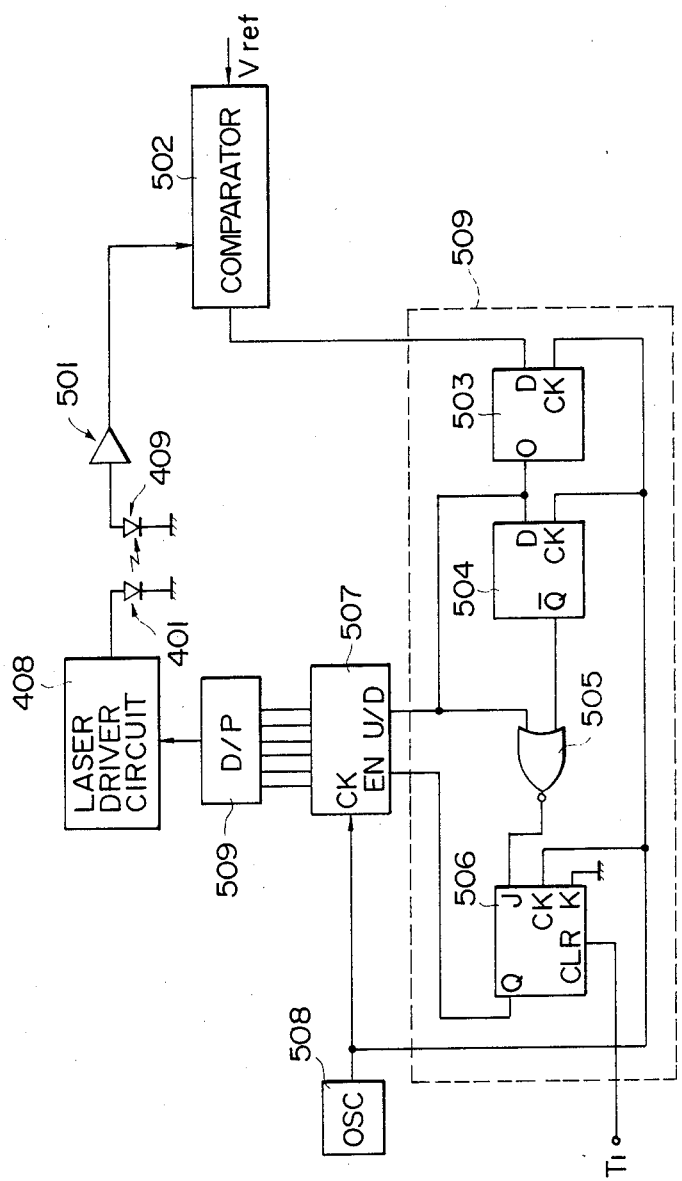
FIG. 5 is a schematic illustration showing the detailed structure of a stabilizing feed-back loop which uses a counter and which may be advantageously applied to the printer of FIG. 4.

FIG. 5 shows in detail one example of the control circuit 410 associated with the semiconductor laser driver circuit 408. In the structure shown in FIG. 5, when a timing signal $T_1$ for initiating an output control operation is input, a JK flipflop 506 is cleared and its output signal is rendered low, thereby allowing an up/-down (u/d) counter 507 to carry out its counting operation. A comparator 502 compares a detection signal from the light detector 409 with a reference signal Vref and supplies its output signal to a D flipflop 503, which is latched by a clock signal from an oscillator 508. And, the output signal from the D flipflop 503 is supplied to the u/d counter 507 as a count mode signal and at the same time latched into a D flipflop 504 by the clock signal from the oscillator 508. The non-inverting output signal from the D flipflop 503 is supplied to one input terminal of a NOR circuit 505 whose other input terminal receives an inverting output signal from the D flipflop 504, and the JK flipflop 506 is set by the output signal from the NOR circuit 505.

The light detector 409 produces a detection output signal which is proportional to the intensity of the laser beam received from the semiconductor laser 401 and this detection output signal is amplified by an amplifier 501 and supplied to the comparator 502, where the detection output signal is compared with the reference voltage Vref, and, thus, the comparator 502 supplies a high level or low level output signal depending on the outcome of the comparison between the detection output signal and the reference voltage Vref. Now, if the output signal from the comparator 502 is a high level signal, i.e., the light intensity of the laser beam emitted from the laser 401 is above a predetermined reference level corresponding to the reference voltage Vref, then when the count operation of the u/d counter 507 is permitted by the timing signal $T_1$, the u/d counter 507 is forced to serve as a down counter by a high level output from the D flipflop 503. The output signal from the u/d counter 507 is then converted into an analog signal by a D/A converter 509, and the thus converted analog signal is supplied to the laser driver circuit 408, where the driving current to be supplied to the semiconductor laser 401 is reduced, thereby causing the level of the detection output signal produced by the light detector 409 to be lowered. And, when the output signal from the comparator 502 is inverted from high level to low level, the output signal from the D flipflop 503 becomes low level, which causes the output signal from the NOR circuit 505 to be high level, so that the JK flipflop 506 is set, thereby inhibiting the count operation by the u/d counter 507.

On the other hand, if the output signal from the comparator 502 is at low level, i.e., the light intensity of the laser beam emitted from the semiconductor laser 401 is below the predetermined level corresponding to the reference voltage Vref, when the count operation of the u/d counter 507 is permitted by the timing signal $T_1$, then the u/d counter 507 is forced to function as an up counter by the low level output from the D flipflop 503, thereby increasing the driving current to the semiconductor laser 401, so that the detection output signal from the light detector 409 also increases. And, when the output signal from the comparator 502 changes from low level to high level, the output signal from the D flipflop 503 becomes high level, so that the u/d counter 507 starts to function as a down counter. At this time, the output signal from the NOR circuit 505 remains at low level, so that the JK flipflop 506 is not reset and the count operation of the u/d counter 506 remains to be permitted. That is, when the light intensity of the laser beam emitted from the laser 401 has increased beyond the predetermined reference level, the u/d counter 507 is not set in a count inhibit state; on the other hand, the count inhibit state is established when the light intensity of the laser beam emitted from the laser 401 has decreased below the reference level. As a result, the holding current of the laser 401 is maintained at constant at all times. Alternatively, it may also be so structured that when the light intensity of the laser beam emitted from the laser 401 has decreased below the predetermined reference level, the u/d counter 507 is not set in the count inhibit state; whereas, the count inhibit state is established when the light intensity of the laser beam emitted from the laser 410 has increased above the reference level. The holding current of the laser 401 may also be maintained at constant with this alternative structure.

As may be seen, that portion of the structure shown in FIG. 5 which is enclosed by the dotted line 509 detects the change in level of the output signal from the comparator 502 and thus is equivalent to an edge detecting circuit for permitting or inhibiting the count operation of the u/d counter 507. As described above, the feed-back loop controls the intensity of the laser beam emitted from the laser 401 such that the difference between the detection output signal produced from the light detector 409 and the reference voltage Vref comes within a predetermined range, whereby the light intensity of the laser beam is maintained substantially at constant. Of course, during the operation of the feed-back loop, the laser beam is not modulated by the image information signal.

Figure 6:
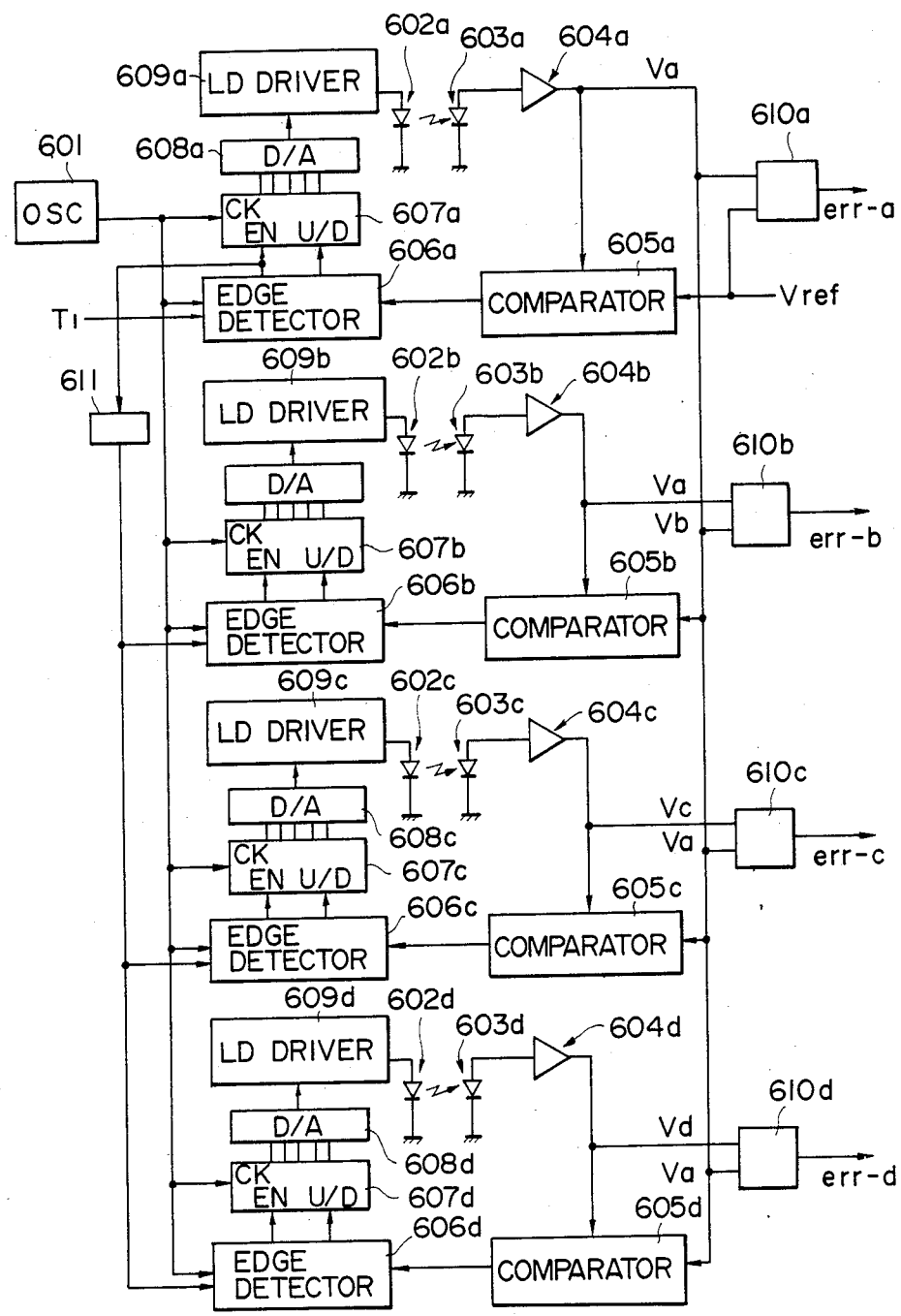
FIG. 6 is a block diagram showing the detailed structure of one example of the control system shown in FIG. 2.

Referring now to FIG. 6, there is shown a specific embodiment of the control circuit for integrally controlling a plurality of semiconductor lasers, which is constructed in accordance with the preferred embodiment of the present invention and advantageously applicable to the color printer of FIG. 1. The control circuit shown in FIG. 6 is similar in structure to the previously described feed-back loop shown in FIG. 5 when examined in part; however, it is to be noted that the control circuit of FIG. 6 contains the same number of feed-back loops as that of the semiconductor lasers 602a through 602d. In the particular embodiment shown in FIG. 6, four feed-back loops each associated with one of the four semiconductor lasers 602a through 602d correspond to the structure shown in FIGS. 1 and 2. It should be noted, however, that these four stabilizing feed-back loops of the embodiment shown in FIG. 6 are not independently operated, and, instead they are operated in association.

When a timing signal $T_1$ is input into an edge detecting circuit 606a, the laser beam emitted from the semiconductor laser 602a is received by a light detector 603a to produce a detection output signal which is then amplified by an amplifier 604a to obtain a detection output voltage Va. This output voltage is then supplied to a comparator 605a to be compared with a predetermined reference voltage Vref, so that the comparator 605a supplies an output signal either at high level or at low level depending on the level of output voltage Va. An u/d counter 607a serves either as an up counter or as a down counter depending on the level of the output signal from the comparator 605a. The u/d counter 607a supplies its output signal to a D/A converter 608a which produces an analog signal corresponding to the count of the counter 607a. The analog signal thus produced is supplied to a laser driver circuit 609a which either increases or decreases the level of driving current to be supplied to the associated laser 602a in accordance with the analog signal. With this structure, the timing when the output signal from the comparator 605a changes from low level to high level (or from high level to low level) is detected by the edge detecting circuit 606a, whereby the count operation by the u/d counter 607a is inhibited, thereby holding the driving current to be supplied to the laser 602a from the driver circuit 609a at constant. With this operation, the light intensity of the laser beam emitted from the laser 602a may be maintained at constant.

The output signal from the edge detecting circuit 606a to an enable (EN) input terminal of the u/d counter 607a changes from low level to high level when the light intensity of the laser beam emitted from the laser 602a is controlled to be at constant, so that the count operation of the u/d counter 607a is inhibited. At the time when this EN signal changes from low level to high level, the timing signal generating circuit 611 generates a pulse signal. With this pulse signal, the JK flip-flops of the edge detecting circuits 606b through 606d are cleared, thereby initiating the output control operation for the semiconductor lasers 602b through 602d. At this time, the reference voltage to be input to the comparators 605b through 605d is set at the output voltage Va of the amplifier 604a. The control feed-back loop circuit for each of these semiconductor lasers 602b through 602d carries out a function similar to the one described with reference to FIG. 5 previously. That is, the light intensity of each of the laser beams emitted from the lasers 602b through 602d is controlled to be maintained at constant such that the output voltage from each of the amplifiers 604b through 604d is substantially equal to the voltage Va.

When the light intensity of the laser 602a is maintained at constant, the output voltages Vb through Vd from the amplifiers 604b through 604d, respectively, do not agree with the voltage Va; on the other hand, the voltages Vb through Vd are each smaller than Va by a voltage which is equivalent to the count value corresponding to one count step of each of the D/A converts 608b through 608d. However, voltages Vb through Vd should be at the same level. As a result, the light intensity for each of the lasers 602a through 602d may be set at constant with the exception of a difference corresponding to the count value corresponding to one count step of the D/A converters 608a through 608d. If it is desired to eliminate this one count step difference, the system may be so structured that the value of one count step is either added to or subtracted from the count of each of the u/d counters 607b through 607d after completion of the light intensity control (stabilizing) operation. If done so, then the light intensities of all of the four lasers 602a through 602d can be set at constant at the same level.

For example, if the edge detecting circuits 606a through 606d are so structured that the count operations of the u/d counters 607a through 607d are inhibited when the light intensities of the laser beams emitted from the semiconductor lasers 602a through 602d have decreased below the reference level, the light intensity of each of the semiconductor lasers 602b through 602d is smaller than the light intensity of the semiconductor laser 602a by the amount of light intensity decrement corresponding to a single count step of each of the D/A converters 608b through 608d. Thus, by adding this amount light intensity decrement to the count of each of the u/d counters 607b through 607d at the time of completion of the light intensity stabilization control operation, the light intensity of each of the semiconductor lasers 602b through 602d is maintained at constant at the same level as that of the semiconductor laser 602. On the other hand, if the edge detecting circuits 606a through 606d are so structured that the count operations of the u/d counters 607a through 607d are inhibited when the light intensities of the semiconductor laser 602a through 602d have increased above the reference level, the light intensities of the semiconductor lasers 602b through 602d are maintained at constant at the same level as that of the semiconductor laser 602a by subtracting an one count amount from the value of each of the u/d counters 607b through 607d upon completion of the light intensity stabilization control operation.

Figure 7:
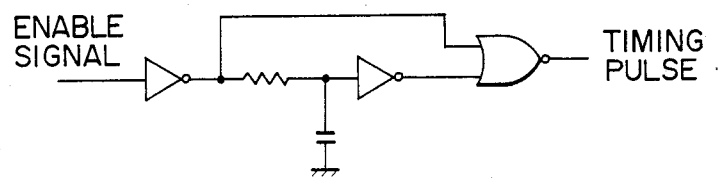
FIG. 7 shows one example of the timing generating circuit 611 provided in the structure of FIG. 6.
Figure 8:
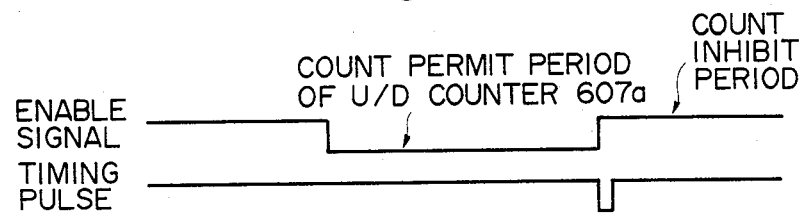
FIG. 8 is a timing chart which is useful for understanding the operation of the structure shown in FIG. 7.

The timing generating circuit 611 may be comprised of a well known rising edge detecting circuit. One example of such a rising edge detecting circuit is schematically shown in FIG. 7 and its operation may be easily understood once reference is made to FIG. 8. Briefly stated, the timing signal is generated at that portion of the enable signal input to the u/d counter 607a which changes from low level to high level, which causes the edge detecting circuits 606b through 606d to be cleared to initiate the light intensity stabilization control operation for the remaining sets including elements indicated by numerals followed by b's through d's.

Now, the arithmetic circuit 46 shown in FIG. 2 corresponds to each of blocks denoted by 610a through 610d which are identical in structure. And, thus, only the arithmetic circuit 610a will be described in detail below. The arithmetic circuit 610a receives not only the detection output voltage Va from the amplifier 604a, but also the predetermined reference voltage Vref. The arithmetic circuit 610a may, for example, include a window comparator which supplies a high level output to indicate the fact that the light intensity of the semiconductor laser 602a is within a normal range if Va falls in a voltage range between Vref−Va− and Vref+Va+, and, on the other hand, supplies a low level output to indicate the fact that the light intensity of the semiconductor laser 602a is outside of the normal range if Va falls outside the voltage range between Vref−-Va− and Vref+Va+. Here, the system may also be so structured that the output under normal conditions is set at low level and the output under abnormal conditions is set at high level.

Alternatively, the system may also be so structured that an alarm signal from each of the arithmetic circuits 610a through 610d is gated by an externally applied control signal (for example, by additional provision of an AND gate), in which case the alarm signal is prevented from being issued unnecessarily. In this case, the alarm signal is allowed to be output only when the control signal is applied externally. Such an alarm signal is preferably applied to an alarm lamp and/or to the overall control circuit to stop the imaging operation. When the above-described window comparator is used, a normal output is obtained when Va falls within a voltage range of Va+ +Va− including Vref. It is preferable that at least one of Va+ and Va− be adjustable independently.

Figure 9:
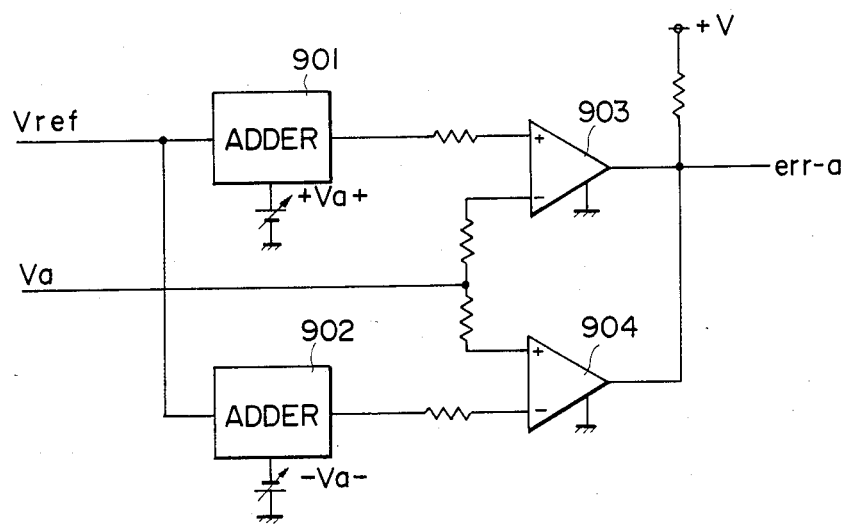
FIG. 9 is a schematic illustration showing one example of a window comparator which may be applicable to the structure of FIG. 6.
Figure 10:
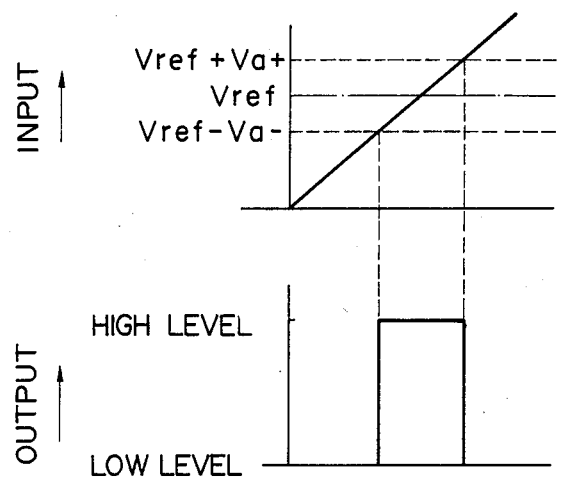
FIG. 10 shows a graph which is useful for understanding the operation of the window comparator shown in FIG. 9.

FIG. 9 shows the detailed structure of one example of such a window comparator which can be used advantageously to the present invention. Vref is added to the upper voltage limit +Va+ at an adder 901 and this added result is input to the non-inverting input terminal of a comparator 903. On the other hand, Vref is added to the lower voltage limit −Va− at another adder 902 and this added result is input to the inverting input terminal of another comparator 904. Thus, the combined output of comparators 903 and 904 is at high level if Va is in the range between Vref+Va+ and Vref−Va−; whereas, the output is at low level if Va is outside the range between Vref+Va+ and Vref−Va−. This operation would be better understood if reference is made to FIG. 10.

In the stabilization control circuit shown in FIG. 6, the light intensity stabilizing control operation has been carried out first for the semiconductor laser 602a, and, then, the similar operation is carried out for each of the remaining semiconductor lasers 602b through 602d using the output voltage Va from the amplifier 604a as a reference. For this purpose, the timing generating circuit 611 is provided. As an alternative, the system may be structured to supply a timing signal to each of the edge detecting circuits 606a through 606d independently from one another to carry out the light intensity stabilization control operation for each of the lasers 602a through 602d, in which case the timing generating circuit 611 may be discarded. In addition, if there is no appreciable temporal difference in the timing of carrying out the light intensity stabilization control operation for each of the semiconductor lasers 602a through 602d, then Vref may be used instead of Va as the reference voltage to be input to the comparators 605b through 605d. The reason why Va is used as the reference voltage to the comparators 605b through 605d resides in the fact that the scatter in light intensity among the semiconductor lasers 602b through 602d may be made smaller by using Va as the reference instead of Vref in the case in which the light intensity stabilization control operation for the semiconductor lasers 602b through 602d is to be carried to after a predetermined time interval upon completion of the light intensity stabilization control operation for the semiconductor laser 602a.

If the same timing signal T₁ is applied to each of the edge detecting circuits 606a through 606d and the same reference voltage Vref is applied to each of the comparators 605a through 605d, all of the semiconductor lasers 602a through 602d start their light intensity stabilization control operations at the same time, whereby the light intensity of each of the four semiconductor lasers 602a through 602d is stabilized at constant based on the same reference voltage Vref.

Figure 11A:
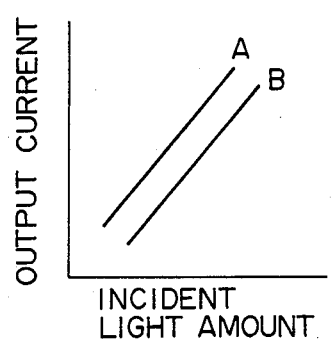
FIGS. 11a and 11b are graphs which are useful for understanding a few approaches for correcting the scatter in characteristic of individual light detectors.
Figure 11B:
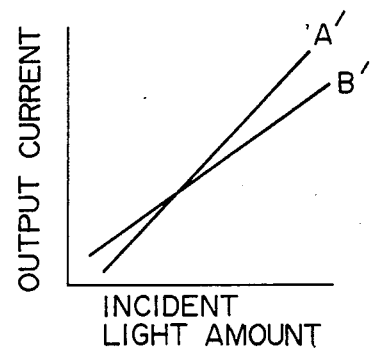

In the above-described example with reference to FIG. 6, the first semiconductor laser 602a has first been subjected to the light intensity stabilization control operation; however, any one of the other three 602b through 602d may be selected for the first operation instead of the first semiconductor laser 602a. As described before, the output voltages of the amplifiers 604a through 604d may be stabilized within a range corresponding to the value of one step of the D/A converter 607a through 607d. And, the range of the light intensity corresponding to the one step may be varied by adjusting the full-scale output of each of the D/A converters 608a through 608d. As the light detector 409 shown in FIG. 5, use is often made of a photodiode or a PIN photodiode. These elements produce a current output in proportional relation to the amount of incident light. As in the case of FIG. 6, if use is made of a plurality of light intensity detector 603a through 603d and the light intensity stabilization control operation for each of the semiconductor lasers 602a through 602d must be carried out to the extent that the scatter of output characteristic of each of the light intensity detectors 603a through 603d should be taken into account, or if the light intensity stabilization control operation need not be carried out at high accuracy and the scatter of output characteristic of each of the light intensity detectors 603a through 603d is allowed to occur, then, even if the light intensity stabilization control operation were carried out to obtain the conditions of Va being substantially equal to Vref or Vb through Vd being substantially equal to Va, there would occur a situation in which the light outputs of the semiconductor lasers 602a through 602d would not be stabilized at constant at the same level, though slightly, due to the scatter in output characteristic of individual light intensity detectors 603a through 603d. FIGS. 11a and 11b show such examples. As a method for correcting such an individual scatter in output characteristic of light intensity detectors 602a through 602d, the offset values of the amplifiers 604a through 604d may be individually varied corresponding to the output characteristics of the intensity detectors 602 through 602d, as shown in FIG. 11a; on the other hand, the gain as well as the offset value may be varied individually, as shown in FIG. 11b. For this purpose, it is preferable to provide an offset value adjusting mechanism and/or a gain adjusting mechanism to each of the amplifiers 604a through 604d.

Figure 12:
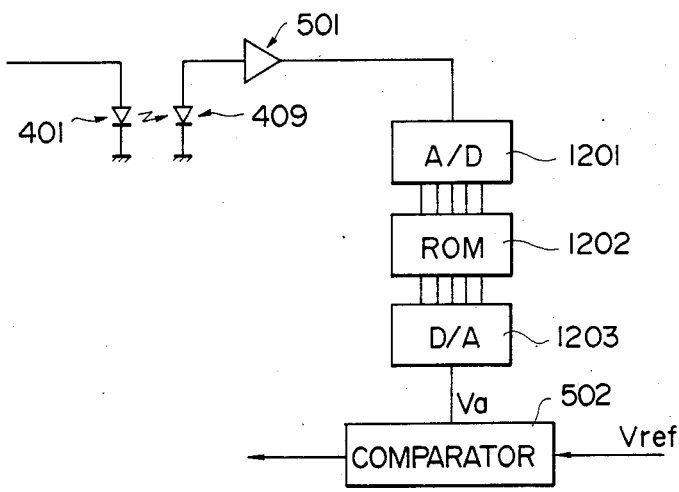
FIGS. 12 and 13 are schematic illustrations showing other embodiments of the present invention.

FIG. 12 shows a further embodiment of the present invention which may be applied to a more general situation, including, for example, the case in which the output characteristic of each of the light intensity detectors 603a through 603d is nonlinear. FIG. 12 shows only the structure from the light intensity detector 409 to the comparator 502. The laser beam emitted from the semiconductor laser 401 is received by the light intensity detector 409 which produces a detection output signal and this signal is amplified by the amplifier 501. This amplified signal is then supplied to an A/D converter 1201 to obtain an equivalent digital data which is then supplied to address a particular storage position of a memory (ROM) 1202. The address value in this case corresponds to the level of the output from the light intensity detector 409. The memory 1202 stores a table of conversion data for correcting the output characteristic of the light intensity detector 409 so as to output a value corresponding to the light output of the semiconductor laser 401. Since the output from the memory 1202 is a digital data, it is supplied to a D/A converter 1203 to convert it into an equivalent analog value, which is then supplied to the comparator 502. With such a scheme, if the light outputs from the semiconductor lasers 602a through 602d are the same, Va through Vd may be considered to be at the same level.

Figure 13:
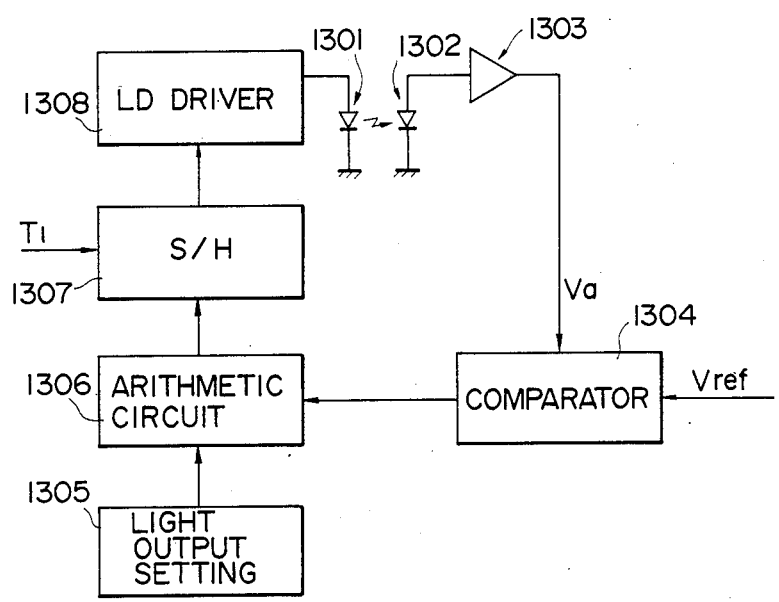

The above-described example is the case in which use is made of a counter in the light intensity stabilization control feed-back loop. FIG. 13 shows a further embodiment of the present invention, which corresponds in function to the embodiment shown in FIG. 5, but which does not use a counter. In the embodiment shown in FIG. 13, the laser light beam emitted from a semiconductor laser 1301 is incident on a light intensity detector 1302 which thus produces a detection output signal. This detection signal is then amplified by an amplifier 1303 to obtain a detection voltage Va, which is then supplied to a comparator 1304 which also receives a reference voltage Vref. Thus, the comparator 1304 compares Va with Vref to produce as its output a difference or error signal Vref−Va. For example, if the detection voltage is larger than the reference voltage, then the difference of Vref−Va is negative in value; on the other hand, if the detection voltage is larger in value than the reference voltage, then the difference of Vref−Va is positive in value. When the condition of Vref=Va is obtained, the output from the comparator 1304 becomes 0 V. Under the condition, an arithmetic circuit 1306 supplies an output which corresponds to a value set by a light output setting circuit 1305, so that the light output from the semiconductor laser 1301 under the condition is the one set by the light output setting circuit 1305.

A sample and hold (S/H) circuit 1307 maintains the level of the driving current to be supplied to the laser 1301 and thus the light intensity of the laser beam emitted from the laser 1301 at constant once the light intensity stabilization control operation has been completed. And, when the timing signal T₁ is input to the S/H circuit 1307, the holding condition is released and the next light intensity stabilization control operation is initiated. If the output from the comparator 1304 is positive, i.e., the light intensity of the laser 1301 being lower than the reference level, then the difference amount is added to increase the light intensity of the laser 1301. On the contrary, if the output from the comparator 1304 is negative, i.e., the light intensity of the laser 1301 being higher than the reference level, then the difference amount is subtracted to lower the light intensity of the laser 1301. As a result, in a manner similar to the one described with reference to FIG. 5, the light intensity stabilization control operation is carried out to obtain the condition of Va=Vref. When this condition has been obtained, the light intensity of the laser 1301 is stabilized.

Figure 14:
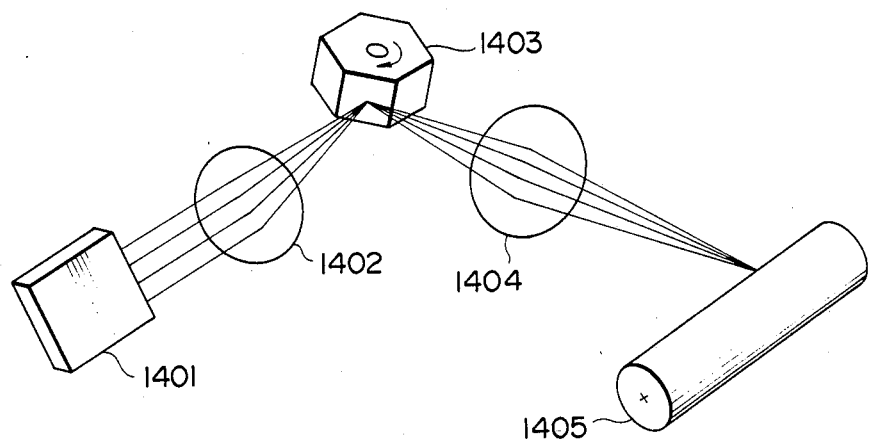
FIG. 14 is a schematic illustration showing a laser beam printer using a plurality of laser beams.
Figure 15:
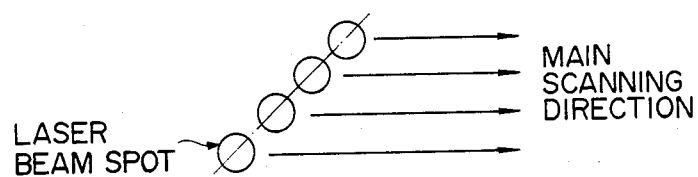
FIG. 15 is a schematic illustration which is useful for understanding the operation of the structure shown in FIG. 14.

It should also be noted that the present invention may be applied to other imaging systems than the printer shown in FIG. 1 as long as provision is made of a plurality of semiconductor lasers. For example, the present invention may also be applied to the case in which use is made of a single semiconductor laser capable of emitting a plurality of laser beams, as shown in Fig. 14. That is, a plurality of laser beams emitted from a single semiconductor laser 1401 provided with a multiple of laser beam emitting points pass through a lens 1402 and deflected by a rotating polygon mirror 1403 in the main or optical scanning direction over a predetermined angle. These laser beams deflected by the polygon mirror 1403 pass through a fθ lens 1404 and scanned across the peripheral surface of a photosensitive drum 1405 in rotation in the auxiliary scanning direction, which is normal to the main or optical scanning direction, so that an electrostatic latent image is formed on the drum 1405. A printer having such a structure is often called a multi-beam printer. As shown in FIG. 15, a plurality of beam spots are formed at the same time on the peripheral surface of the photosensitive drum 1405. In such a case, if there is a scatter in light intensity among the plurality of laser beams, its effect is vividly reflected in the resulting image. For example, if either one of the illustrated four laser beams has a larger light intensity compared with the other three, then the dark line will appear at a predetermined pitch, which would significantly deteriorate the image quality. Thus, it is vital that all of these plural laser beams have substantially the same light intensity. Such a problem can be easily obviated by the application of the present invention as described before. It should also be noted that the present invention may be applied to any other imaging apparatus than those shown in FIGS. 1 and 14.

While the above provides a full and complete disclosure of the preferred embodiment of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A method for stabilizing light intensity in a system having a each of a plurality of light beams used for forming an image, wherein each of said light beams has a respective light intensity, comprising the steps of:
   detecting the light intensity of each of the plurality of light beams and generating a respective light intensity detection signal for each of said light beams;
   selecting one of said light intensity detection signals as a reference; and
   adjusting the light intensity of said light beams such that the difference between each of the detected light intensities and the reference is within a first predetermined range.

2. The method of claim 1 further comprising the step of determining scatter in the detected light intensities and generating an alarm signal if the scatter among the detected light intensities has exceeded a second predetermined range.

3. Apparatus comprising:
   laser beam emitting means for emitting a plurality of laser beams each of which has a respective light intensity;
   a plurality of light intensity detecting means for detecting the light intensity of each of the plurality of said laser beams individually and for producing a respective detected light intensity signal for each of said light beams;
   a respective input means of receiving a respective image signal for each of said light beams and laser driving means which supply driving signals to drive said laser beam emitting means and are responsive to image signals received by said input means to modulate said plurality of laser beams with said image signals;
   a plurality of correcting means, wherein each correcting means is for a respective one of said light beams and each correcting means corrects the driving signal supplied from a respective one of said laser driving means to said laser emitting means for a respective one of said plurality of laser beams; and synchronizing means for synchronizing a selected one of said correcting means with the rest of said plurality of correcting means.

4. Apparatus as in claim 3 wherein said laser beam emitting means includes a plurality of semiconductor lasers each emitting a corresponding one of said plurality of laser beams.

5. Apparatus as in claim 3 wherein said synchronizing means includes a timing signal generating circuit for generating a timing signal to be supplied to each of the rest of said plurality of correcting means.

6. A system comprising:
a source of a plurality of laser beams each of which has a respective intensity, wherein said source includes means for individually regulating the intensities of said laser beams;
a plurality of detectors each of which detects the intensity of a respective one of said laser beams and generates a respective detector signal related to the detected intensity;
a control circuit coupled to the detectors to receive the detector signals and to generate in response a respective driving signal for each of said laser beams;
means for selecting one of said driving signals, which is for a selected ones of said beams, and for adjusting the other of said driving signals in accordance with a selected parameter of the selected driving signal to thereby generate adjusted driving signal; and
means for applying said selected driving signal and said adjusted driving signals to said means for regulating to thereby individually regulate the intensities of said laser beams.

7. A system as in claim 6 including a circuit responsive to the detector signals for calculating a scatter parameter thereof and for generating an alarm if the scatter parameter exceeds a threshold.

8. A system as in claim 7 including a video data memory for supplying, to said source, respective information signals for modulating the respective laser beams in accordance therewith, means for forming latent images corresponding to the respective beams, and means for developing the images in respective colors and for transferring the developed images in superimposed relationship to a transfer medium to thereby form thereon a multi-color image defined by said information signals.

9. A system as in claim 8 in which the control circuit comprises a source of a reference signal, a comparator which compares the detector signal for the selected beam with the reference signal and in response generates a selected error signal related to the discrepancy between the compared signals, and a comparator for each of the remaining beams which compares the detector signal for the selected beam with the detector signals for the respective other beams and in response generates respective other error signals, and wherein the respective driving signals are corrected in accordance with respective error signals.

10. A system as in claim 6 including a video data memory for supplying, to said source, respective information signals for modulating the respective laser beams in accordance therewith, means for forming latent images corresponding to the respective beams, and means for developing the images in respective colors and for transferring the developed images in superimposed relationship to a transfer medium to thereby form thereon a multi-color image defined by said information signals.

11. A system as in claim 10 in which the control circuit comprises a source of a reference signal, a comparator which compares the detector signal for the selected beam with the reference signal and in response generates an selected error signal related to the discrepancy between the compared signals, and a comparator for each of the remaining beams which compares the detector signal for the selected beam with the detector signals for the respective other beams and in response generates respective other error signals, and wherein the respective driving signals are corrected in accordance with the respective error signals.

* * * * *